United States Patent [19]

Drukier et al.

[11] 4,034,399

[45] July 5, 1977

[54] INTERCONNECTION MEANS FOR AN ARRAY OF MAJORITY CARRIER MICROWAVE DEVICES

[75] Inventors: Ira Drukier, New York, N.Y.; Edward Mykietyn, Trenton, N.J.

[73] Assignee: RCA Corporation, New York, N.Y.

[22] Filed: Feb. 27, 1976

[21] Appl. No.: 662,001

[52] U.S. Cl. .................................... 357/68; 357/15; 357/41; 357/51; 357/69; 357/74; 357/80

[51] Int. Cl.² ................. H01L 23/48; H01L 23/02; H01L 39/02; H01L 27/02

[58] Field of Search .................. 357/15, 41, 51, 68, 357/69, 74, 80

[56] References Cited

UNITED STATES PATENTS

| | | | |
|---|---|---|---|
| 3,749,985 | 7/1973 | Dawson | 357/51 |
| 3,942,186 | 3/1976 | McAvoy et al. | 357/15 |
| 3,961,415 | 6/1976 | Davis | 357/80 |

*Primary Examiner*—Edward J. Wojciechowicz
*Attorney, Agent, or Firm*—H. Christoffersen; Robert P. Williams; William L. Muckelroy

[57] ABSTRACT

An improved means for interconnecting a semiconductor array to a carrier wherein the array comprises a plurality of MESFET transistors each having a distinct gate pad and a distinct drain pad, the improvement comprising a bilaterally symmetric conductive member connecting a plurality of pads, for example gate pads, to a common bus bar located on the carrier and a bilaterally symmetric conductive member connecting a plurality of pads, for example drain pads, to another common bus bar located on the carrier, wherein a length for each conductive member determines and provides a value of inductance at the operating frequency of the array which is substantially the same from the bus bar to each connected pad.

10 Claims, 12 Drawing Figures

INTERCONNECTION MEANS FOR AN ARRAY OF MAJORITY CARRIER MICROWAVE DEVICES

The invention described herein was made in the performance of work under a contract with the Department of the Air Force.

This invention relates to a contact and lead arrangement for an integrated array of majority carrier microwave devices. More particularly, the invention relates to a means for providing matched inductive inputs to an integrated array of self-ballasting or current limiting microwave frequency devices. The lead arrangement of the invention is therefore applicable to arrays of devices such as Schottky barrier metal-semiconductor-field-effect-transistors (MESFETS) for operation at microwave frequencies and arrays of diodes such as Gunn diodes and PIN diodes for switching high power. The invention is not applicable to minority carrier devices such as bipolar transistors because of the absence of self-ballasting of the individual junctions of the bipolar transistors.

As described in U.S. Pat. No. 3,430,115 issued to George J. Gilbert, on Feb. 25, 1969, it is known that contact with the emitter and base regions of an overlay or multiple junction bipolar transistor may be achieved by comb contacts wherein the teeth of one comb make connections to the emitter and the teeth of another comb make connections to the base regions.

Multiple junction bipolar transistors which are minority carrier devices are not self-ballasting. If a greater amount of current flows through one junction of a bipolar transistor with respect to the other junctions of the transistor, the temperature coefficient of resistance and the mobility of minority carriers are so interrelated that the amount of current flowing through the junction having the increased current tends to increase rather than decrease. This action robs the other junctions of power and accordingly a major portion of the input RF power to the bipolar device is transmitted through the "hogging" junction. Hence, as the temperature within the minority carrier bipolar device increases the amount of current going through that device or that junction increases.

As shown in Gilbert supra, electrical parameters, such as impedance or internal resistance, of bipolar transistors vary from junction to junction, and because of the lack of self-ballasting the amount of current in one junction tends to run away with or "hog" the input current to the entire device, causing a subsequent failure of the "hogging" junction. One way of resolving this uneven distribution of current problem in the bipolar transistor is to ballast the various junctions by the deposition of a resistor at the tip of each tooth of the comb contact. Gilbert proposes to break up the comb contact such that there are individual contacts for each junction of the multiple junction bipolar transistor and in so doing attach a small inductance to each of these individual contacts for the individual junctions. These inductors are TAILORED or selected such that they provide a degree of self-ballasting for the particular junctions involved. These inductors or an individual inductor for a particular junction being connected to the junction contact provide an additional voltage drop to the junction. When there is a surge of current, the inductor resists the passage of more current thereby delimiting the amount of current passing into the junction.

Self-ballasting is not a problem with MAJORITY CARRIER devices such as Schottky gate field effect transistors. The temperature coefficient for mobility of majority carriers in such devices is such that a relatively large current flowing in the one device of a parallel connected integrated array of devices self-limits itself or ballasts itself such that the current decreases to the level of the other devices parallel connected to the array. As the amount of current flowing through a majority carrier device increases so as to increase the temperature, the mobility and as a consequence, the current flowing through such a device, both decrease. Accordingly, in designing and perfecting a lead arrangement and contact arrangement for an array of majority carrier devices such as a Schottky gate field effect transistor array or a PIN diode or GUNN diode array, it is not necessary to consider self-ballasting in making the design.

To obtain the maximum efficiency for such such device arrays it is important to avoid current loops containing unequal input load impedances and inductive reactances. This may be accomplished by equalizing the input inductances or reactances to these devices such that a radio frequency power loss within the input lead to a device or to a plurality of devices of an array is avoided. Proper bilaterally symmetric interconnection equalizes input inductances and reactances.

A method which may be used for the construction of MESFET devices is amply described in U.S. Pat. No. 3,764,865 issued to Napoli et al., Oct. 9, 1973. A MESFET device comprises a source and a drain separated by a channel partially covered by a gate. Usually, metal contacts are formed for the source and the drain and for the gate. The gate is usually formed by depositing a Schottky metal onto the semiconductor surface lying inbetween the source and the gate contacts whereby a Schottky barrier is formed inbetween the Schottky metal and the semiconductor substrate or wafer.

Although MESFET cells are manufactured on a wafer of a semiconductor material, for example, gallium arsenide, the integrated cell must be mounted into an individual package for insertion into a microwave circuit. Once the cells are completed the wafer is scribed and individual cells are separated therefrom. Typically, the cells are rectangular in configuration with a plurality of source contacts located in the vicinity of the center of the chip. The metallizations for the gates are extended to one edge of the rectangular cell and are broadened in contact pads along that edge. The drain metallizations are also extended to an opposite edge of the same side as the source and gate and are broadened into contact pads in a linear array along an opposite edge of the rectangular cell.

Embodiments of the invention will now be described in detail using the accompanying drawings wherein.

MESFET's are usually referred to as cells when the combined gate length of an integrated array of devices is in excess of 600 micrometers. MESFET cells are usually made in integrated arrays and are aligned one adjacent the other in the array such that all of the gate pads are on one edge of a side of the integrated circuit chip and all of the drain pads are on another edge of the chip.

Both the gate pads and the drain pads are illustrated herein as located on the same side of the semiconductor material or substrate onto which the MESFET cell is formed and as on opposite edges of that side for the purpose of simplicity of explanation only.

The inventors have discovered that a solution to the problem of ballasting current in majority carrier device arrays or cells such as MESFET cells by matching the individual inductances or inductive reactances to each field effect transistor is to actually replace each inductive reactance with a single inductive reactance bilaterally symmetric along a particular axis such that all field effect transistors see the same inductive reactance or have a lead attached thereto having an inductive reactance which is physically and integrally the same as the inductive reactances of all other transistors in the cell. The inventors have achieved this result by physically integrating the inductive input reactances of the MESFET cell, for example.

Figure 1:
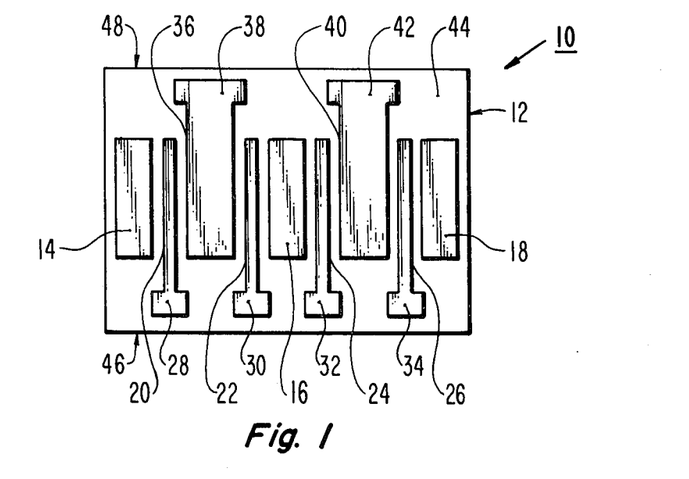
FIG. 1 is a top view of a MESFET cell arrangement.

Shown in FIG. 1 is a MESFET cell 10 comprised of a semiconductor substrate 12 of, for example, gallium arsenide. The semiconductor substrate 12 has appositioned thereto source connections 14, 16 and 18 and gate connections 20, 22, 24, and 26. Each of the gate connections 20–26 has connected thereto a gate pad 28, 30, 32, and 34, respectively. A common drain connection 36 with an accompanying attached drain pad 38 is interposed between gate pads 28 and 30. A common drain connection 40 with an accompanying and connected drain pad 42 is interposed between gate connections 24 and 26. Each of the aforementioned gate, drain, and source connections is on a major surface 44 of the semiconductor substrate 12 with the gate pads 28, 30, 32, and 34 aligned along the common edge 46 of the substrate 12 and the drain pads 38 and 42 aligned along the common edge 48. Although the gates are illustrated as relatively wide with respect to the width or sizes of the sources and drains and their respective pads, these gates are actually about one micron in actual electron path width and the associated gap or aperture between a respective source and drain is approximately 1 to 2 microns.

The source connections 14, 16, 18 are typically 100 micrometers by 150 micrometers. The active gate length may be approximatley 150 micrometers, for example. The area for the drain inbetween two adjacent gates is approximately 150 micrometers by 50 micrometers. A typical size for the entire cell is approximately 300 micrometers by 500 micrometers.

Typically, a MESFET cell is mounted into a U-shaped carrier in an arrangement for subsequent insertion into an RF circuit. When the cell is used as an amplifier, the gates of the cell serve as RF inputs, the drains as RF outputs and the sources are grounded. Typically, the gates are each biased to 0 to −4 volts DC and the drains are each biased at +8 volts DC.

Figure 2:
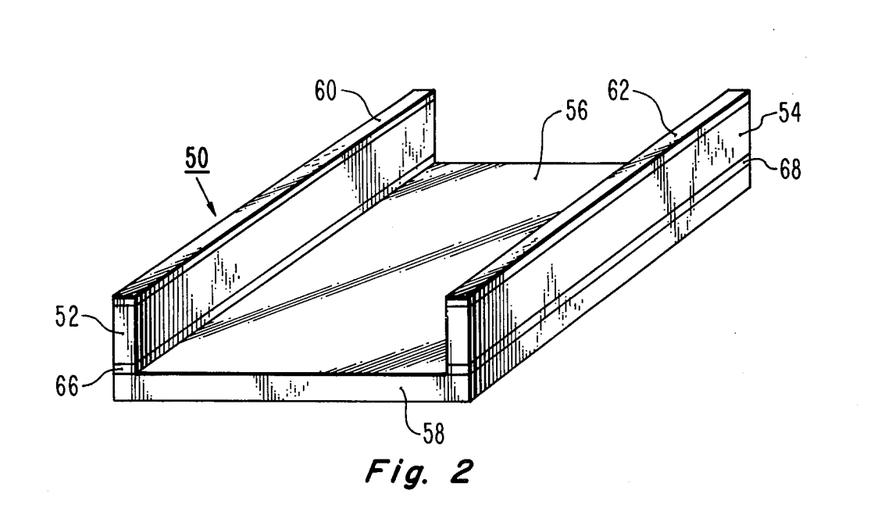
FIG. 2 is a perspective view of a U-shaped holder for a MESFET cell.

There exists another arrangement whereby the MESFET cell of FIG. 1 is fitted in a flip chip arrangement into a U-shaped carrier 50 (see FIG. 2). The U-shaped carrier 50 is comprised of two raised conductive members 52 and 54 of opposite edges of a major rectangular surface 56 of a base member 58. A bus located on one edge of the carrier serves for the input of radio frequency power, the other bus serves as an output for radio frequency power. Thus, the gates must be connected to one of the busses and the drains must be connected to the other bus. The source is connected to the surface 56 of the carrier 50 and is grounded.

The base member 58 is made of oxygen-free high conductively copper, for example. The major surface 56 of the base member 58 is adapted to permanently receive the two members 52 and 54 on opposite edges thereof. The members 52 and 54 are each comprised of a rectangular piece of an insulator such as aluminum oxide having two major end coated with a conductor such as gold. With respect to the member 52, this conductive coating comprises a bus 60 and in the case of the rectangular member 54 this conductive coating comprises a bus 62. The opposite edges 66 and 68 of the rectangular members 52 and 54, respectively, are utilized for connecting in some known fashion the rectangular members 52 and 54 to opposite edges of the major surface 56 of the base member 58.

Figure 5:
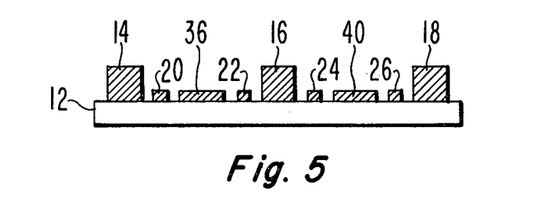
FIG. 5 is a cross-sectional view of FIG. 3 along the line 5-5.

To connect the source to the major surface 56, the individual surfaces of the source connections 14, 16, and 18 on the MESFET cell 10 are plated to a height sufficiently above the height of the surfaces of the gate and drain connections 20–26, 36, 40 (see FIG. 5) such that when the cell is flipped upside down and the source connections 14, 16, 18 contact the major surface 56 of the carrier 50, the drain connections 36, 40 and the gate connections 20–26 are not shorted. This plating arrangement also allows for interconnections from the respective busses to the individual gate and drain pads and ensures that the bonds to these pads do not come into contact with the surface 56.

Figure 3:
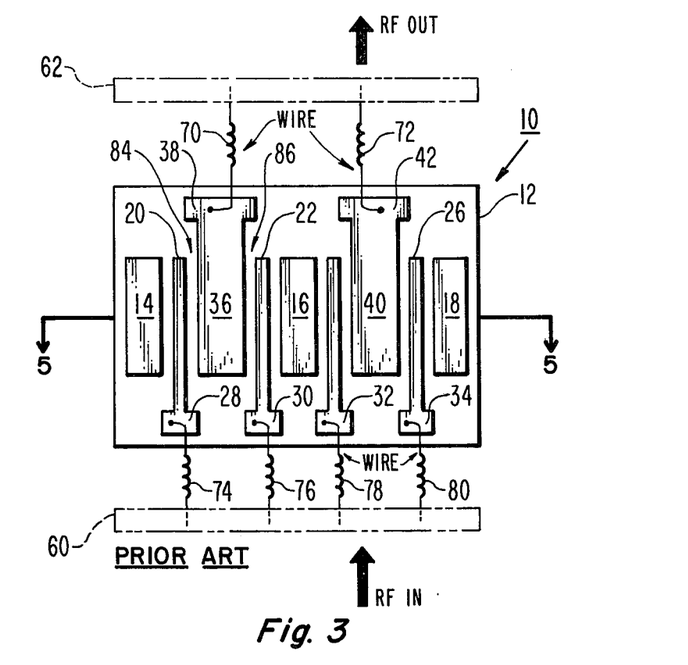
FIG. 3 is an illustrated view of the prior art of the invention.

In one prior art arrangement shown in FIG. 3, individual wires or ribbon wires 70–80 are brought out from the individual gate pads 28–34 and drain pads 38, 42, and are connected to their respective proximate busses 60 and 62, the leads having been previously selected and tailored such that they provide proper inductive reactances. A significant problem with this arrangement is that slight changes in the position of an individual wire usually changes the value of its inductive reactance. This sometimes results in wires which have previously been matched becoming unmatched and thereby giving rise to RF losses in the lead itself prior to the RF being transferred through the gate path to the device or out of the device to the output bus.

Another problem associated with this means of interconnecting the input bus to the various gate pads of the MESFET cell is the difficulty involved in actually matching the inductive reactances of the individual wires or ribbons. In particular, the wires must have the exact same length, curvature and looping to be exactly matched. Small differences in curvature or looping can change the value of the inductive reactance of two wires which are otherwise equal in length.

Although two wires or a plurality of wires for interconnecting pads to a respective bus bar are equal in length, it is still not assured that each wire each be attached at the same point along the wire to actually achieve equal operating lengths. For example, although both wires may be initially the same length, one wire may be attached to a gate pad five micrometers from one end and attached at the other end whereas the other wire may be attached at each end.

Figure 4:
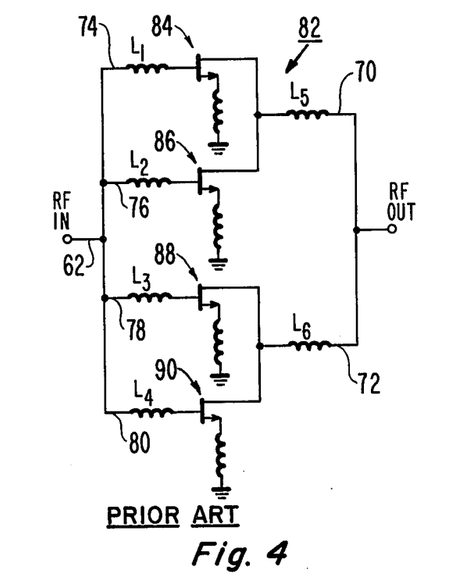
FIG. 4 is a circuit diagram of the prior art lead arrangement.

The circuit for the lead arrangement shown in FIG. 3 is illustrated in the circuit diagram of FIG. 4. In the circuit 82 are shown field effect transistors 84-90 connected in parallel with their respectively sources grounded.

For clarity and further explanation of this invention the reference numerals shown in FIG. 4 will correspond directly with those elements illustrated in the prior art FIG. 3. Hence, the inductances L1, L2, L3 and L4 illustrated in FIG. 4 are actually the wires 74-80 illustrated in FIG. 3 and the inductances L5 and L6 correspond to the wires 70 and 72 of FIG. 3.

As may be observed from the circuit diagram, for the RF power from the input member 62 to be distributed equally among self-ballasting field effect transistors 84, 86, 88, and 90 it is necessary, first, for the inductors L1, L2, L3 and L4 to be equal. Secondly, for the arrangement shown in FIG. 4 to achieve the maximum power output it is necessary for the inductor L5 to be equal to the inductor L6. Any arrangement to the contrary generates a power loss in the respective elements proportional to the absolute value of the reactance provided thereby and the square of the current circulating therethrough.

The interconnecting members of the novel invention may be characterized as bilaterally symmetric about a central bisector. This bisector is chosen such that current flow distributes itself equally on each side thereof within the interconnector. Usually this bisector can be determined by chosing a bisector for the base of the member which base is initially connected to selected pads of a device array. For example, for a rectangular conductive with current flow in the longitudinal direction of the member (along its greatest length), the bisector is the bisector along the greatest dimension of the member; for a trapezoid, the bisector is perpendicular to either of its parallel sides; and for a flat circular or elliptical member, the bisector is the axis thereof equidistant from the two most separated pads interconnected by the member.

Figure 6:
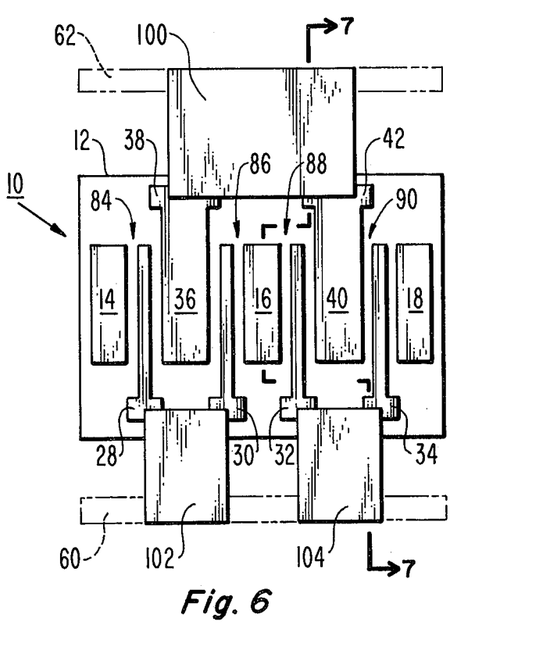
FIG. 6 is a top view of an arrangement of one embodiment of the invention.
Figure 7:
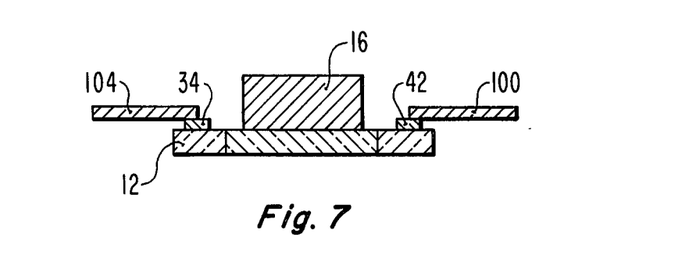
FIG. 7 is a cross-sectional view of FIG. 6 taken along the line 7—7.
Figure 8:
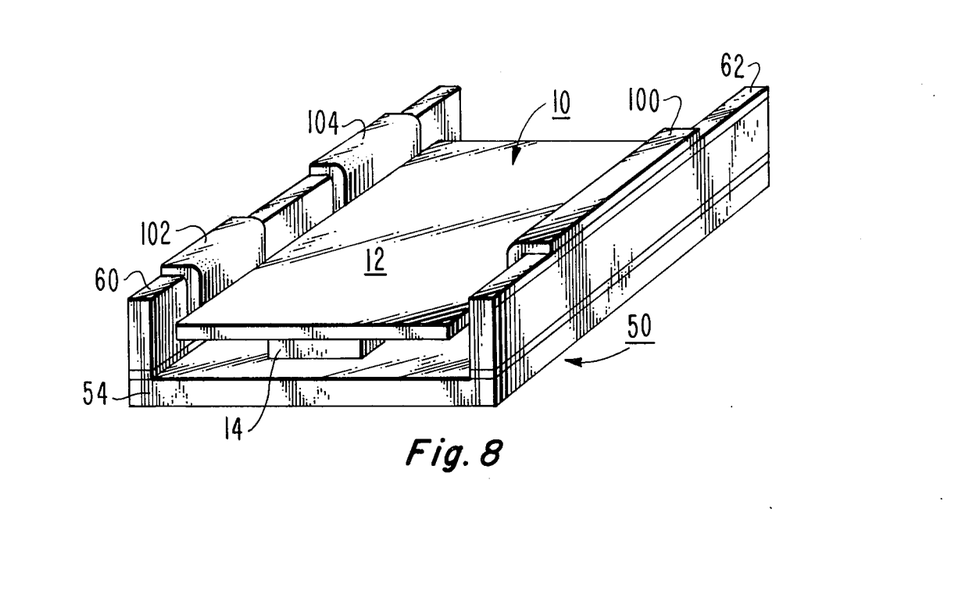
FIG. 8 illustrates a MESFET cell mounted in a U-shaped carrier.

Improvement over the prior art as embodied in the present invention is illustrated in FIG. 6 wherein there is shown a MESFET cell 10 with lead structures, each of which provides a single inductive output to a bus from at least two adjacent pads. Two of these lead structures, referred to herein as large bilaterally symmetric rectangular conductive members 102 and 104, are attached to the gate pads. Gate pads 28, and 30 are symmetrically connected via the conductive member 102 to a gate input bus 60 illustrated in FIG. 3. Similarly, concuctive member 104 symmetrically connects gate pads 32 and 34 to the bus 60. A cross-section of this arrangement taken along the line 7—7 of FIG. 6 is shown in FIG. 7. There is shown a bilaterally symmetric member 100 symmetrically connected to the drain pads 42 and the member 104 connected to the gate pads 34, both pads being supported by the semiconductor substrate 12. Also shown in cross-section is the raised conductive source contact 16 adjacent the substrate 12. A cooperative arrangement of the MESFET cell 10 and the U-shaped substrate holder 50 is illustrated in FIG. 8. The rectangular conductive member 100 and rectangular conductive members 102 and 104 are easily attached to their respective buses 62 and 60. Attachment of these rectangular conductive members may be either by soldering, thermal compression bonding, or other known means.

Whereas in the prior art arrangement for the example shown in FIG. 3, at least two connections had to be made to the drain bus 64, in the present novel arrangement only one connection operation is required and in addition the possibility of a mismatch of the output inductive reactance from either the drain 36 or the drain 40 is eliminated by the member 100 shown in FIG. 8. Moreover, whereas in the prior art embodiment shown in FIG. 3, at least four connections had to be made to the gate input bus 62, using the present novel arrangement, the number of connections is reduced.

Figure 9:
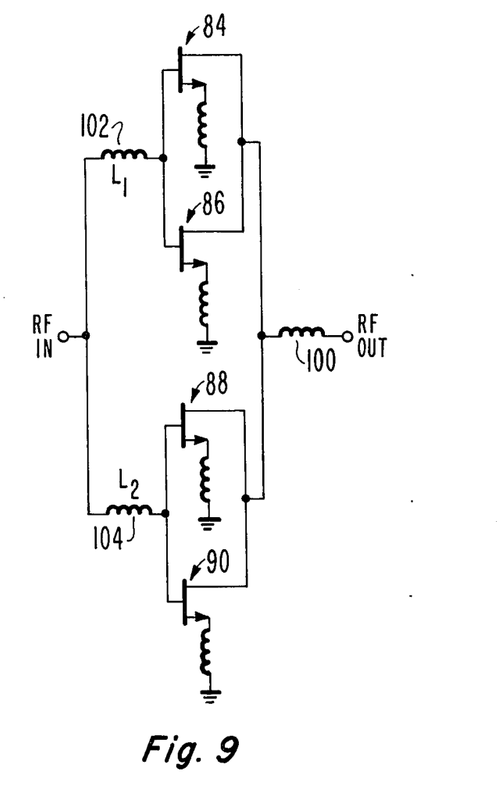
FIG. 9 is a circuit diagram of the lead arrangement shown in FIG. 6.

A circuit diagram for the embodiment of the present novel invention illustrated in FIG. 6 is shown in FIG. 9. There, the output inductance 100 corresponds to the output member 100 and the input inductance 102 corresponds to the rectangular conductive member 102 and the input inductance 104 corresponds to the rectangular conductive member 104. The inductors L1 and L2 of the circuit in FIG. 9 present equivalent inductances to parallel devices 84, 86 and 88 90, respectively. Moreover, the novel lead arrangement presents one output inductance 100 for all of the field effect transistors 84, 86, 88 and 90.

Figure 10:
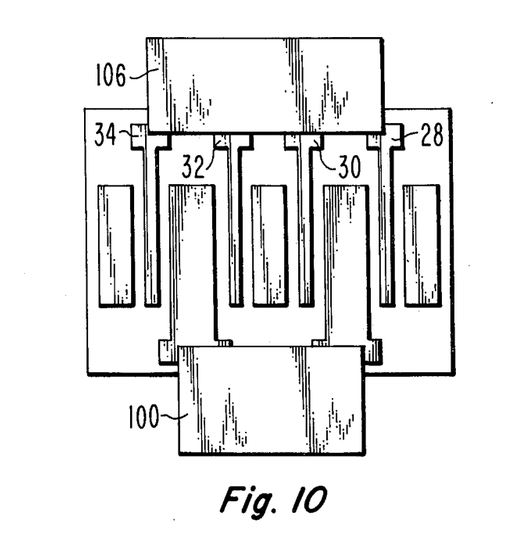
FIGS. 10 and 11 illustrate arrangements which are additional embodiments of the present invention.
Figure 12:
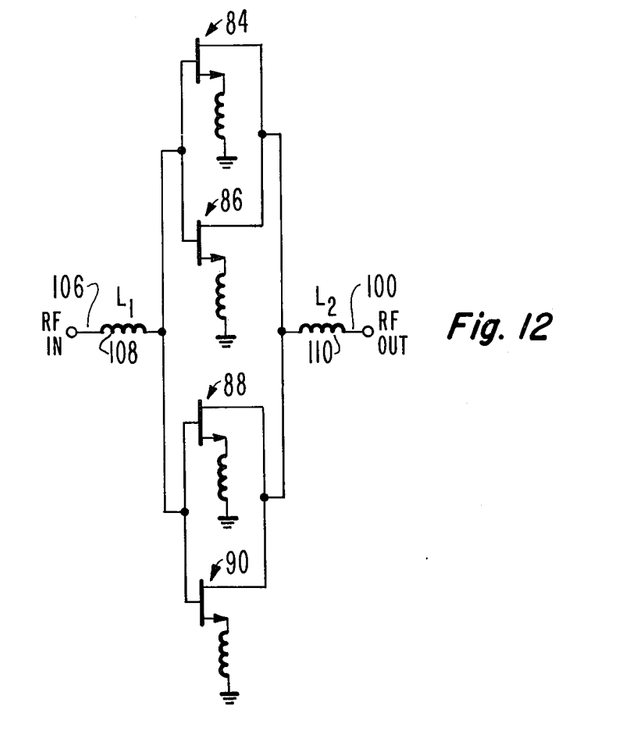
FIG. 12 is a circuit diagram of the lead arrangements illustrated in FIGS. 10 and 11.

Another embodiment using the concept of the present novel invention is illustrated in FIG. 10. There is shown a single rectangular conductive member 106 interconnecting the gate pads 28-34. The circuit diagram for the arrangement shown in FIG. 10 is illustrated in FIG. 12. Only two inductances are present; L1 corresponding to the rectangular member 106 of FIG. 10 and L2 corresponding to the rectangular conductive member 100 of FIG. 10. In view of the concept of the present novel invention which may be stated briefly as the reduction of input or output inductive reactances by combining the respective inductive reactances into a single integrated element, it appears at first glance that the embodiment shown in FIG. 6 has limited utility in view of the embodiment shown in FIG. 10. It is to be appreciated that the embodiment of FIG. 6 is utilized in order to retain a yield and relieve the high cost of producing MESFET cells. This is accomplished by providing a plurality of bilaterally symmetric conductive members such as rectangular members 102 and 104 as illustrated in FIG. 6, which we call "straddle straps", so that in case one of the transistors of the cell is defective in a manner such as to cause an undue amount of current to flow therethrough or diminished current to flow therethrough such as to affect the parameters of the other mutually connected transistors, the defective cell may be completely eliminated from the circuit by removing the interconnecting member. For example, referring specifically to the circuit diagram in FIG. 9, suppose the transistor 84 is defective and it is desired to remove it from the circuit. Utilizing the interconnect arrangement of FIG. 6, it may be removed by disconnecting and removing the rectangular conductive member 102. It is appreciated that a working transistor 86 is also removed. However, the trade-off is that by using this particular arrangement the input inductive reactances for the transistors 88 and 90 are matched using the rectangular member 104 and one-half of the cell, in this example, is in operation and perfectly matched.

Although the number of transistors in the cell 10 as presented herein is four, it should be appreciated that the concept of this invention is equally applicable to various other multiples of transistors per cell. The embodiment shown in FIG. 6, that shown in FIG. 10, and the comparison of the two embodiments is merely for the purpose of illustrating the concept of the invention and demonstrating the utility of the embodiments shown therein.

Figure 11:
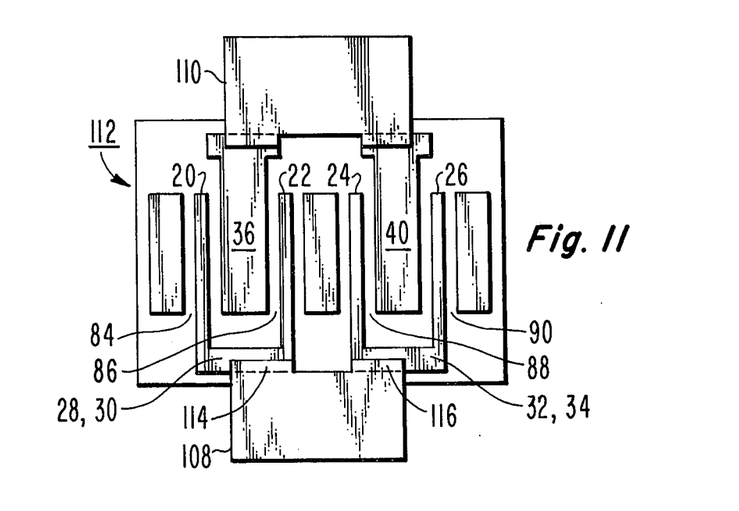

FIG. 11 illustrates another species of the novel invention. There is shown a rectangular conductive member 108 connected to two comb-like metallizations for the gates of a MESFET cell 112. Another rectangular conductive member 110 interconnects mutual drains 36 and 40 of the device. The gates 20–26 of the cell 112 are the same as the gates shown in FIG. 3, 6 and 10. The difference is that the gate contacts 28 and 30 of FIG. 11 have been integrated into a common gate pad interconnecting the gates 20 and 22. The respective gate pads 32 and 34 have been integrated into another common gate pad interconnecting the gates 24 and 26. By this arrangement, the necessity for connecting a rectangular conductive member such as 106 as shown in FIG. 10 to four different pads is eliminated and as a result only two connections are needed for the conductive member 108 shown in FIG. 11.

It has also been discovered by the inventors that by placing fingers on a periphery of rectangular conductive members 100 and 106 in FIG. 10 such that the members 108 and 110 as illustrated in FIG. 11 are achieved, the digitated submembers or fingers formed may be selectively removed to alter the circuit. A transistor may be eliminated from the circuit by tearing away a finger 114 or 116, for example, from the conductive member 108 with tweezers, for example. Even with the fingers attached, the members 108 and 110 remain substantially rectangular. The fingers 114 and 116 are attached in their entirety to the pads and are effectively eliminated as a source of inductive reactance.

The circuit diagram for FIG. 11 is illustrated in FIG. 12. There L1 is equivalent to the member 108 and L2 is equivalent to the member 110.

In another practical example of the application of the invention, the transistors 84 and 86 when connected by wire bonds as illustrated in the prior art FIG. 3 exhibited a gain of 2.5 dB at an operating frequency of 7 GHz. Whereas in the same devices interconnected using the arrangement as shown in FIG. 6, whereby the rectangular conductive member 102 is interconnected the gate pads 28 and 30 to the gate bus 60 and the rectangular conductive member 100 is interconnected the mutual or common drain pad 38 to the drain bus 62, a 7.5 dB gain at 7GHz was realized, all other factors being equal. Moreover, a single device such as transistor 84 connected via wire bond from gate pad 28 to gate bus 62 and drain pad 38 connected via wire bond to drain bus 64 exhibited an 8 dB gain at 7 GHz. Whereas when a second wire bond was connected from gate bus 60, realizable gain dropped to 2.5 dB at 7 GHz, all other factors being equal.

What is claimed is:

1. In a majority carrier transistor array comprising a plurality of integrated field effect transistors situated on a substrate wherein each transistor comprises a source and a drain separated by a channel, a source contact connected to the source, a drain pad connected to the drain, and a gate pad connected to the channel, and wherein each of the gate pads is situated adjacent a common edge of the substrate and each of the drain pads is situated adjacent another common edge, the array further comprising means for connecting each of the gate pads to a first conductive member and means for connecting each of the drain pads to a second conductive member, the improvement wherein the means for connecting each of the gate pads comprises at least ONE bilaterally symmetric first quadrangular conductive member SYMMETRICALLY interconnecting a PLURALITY of gate pads to the first conductive member, each of the gate pads being connected adjacent a COMMON EDGE of the first member, and the improvement wherein the means for connecting each of the drain pads comprises at least ONE second bilaterally symmetric conductive quadrangular member SYMMETRICALLY connecting a plurality of drain pads to the second conductive member, each of the drain pads being connected adjacent a COMMON edge of the second member.

2. The array of claim 1, wherein said first and second quadrangular conductive members are substantially rectangles.

3. In a microwave field effect transistor array comprising a plurality of field effect transistors integrally situated on a substrate wherein each transistor has a gate, a source, and a drain, the gate located between the source and the drain and wherein each transistor has a gate pad connected to the gate and a drain pad connected to the drain, the array further comprising means for connecting each of the gate pads to a first bus on a substrate carrier and means for connecting each of the drain pads to a second bus on the carrier, the improvement wherein the means for connecting each of the gate pads comprises at least one first bilaterally symmetric quadrangular conductive member symmetrically interconnecting a plurality of gate pads to the first bus.

4. The array of claim 3 further comprising the improvement wherein the means for connecting each of the drain pads comprises at least one second rectangular conductive member interconnecting a plurality of drain pads to the second bus.

5. The array of claim 4 wherein each of the gate pads is situated adjacent a common edge of the substrate and each of the drain pads is situated adjacent another common edge of the substrate, and wherein each of the gate pads is connected adjacent a common edge of the first member, an opposite edge of the first member being connected to the first bus and wherein each of the drain pads is connected adjacent a common edge of the second member, an opposite edge of the second member being connected to the second bus.

6. The array of claim 5 wherein each rectangular conductive member is comprised of metal.

7. The array of claim 6 wherein the source of each transistor is relatively taller with respect to the drains and gates and each source is of approximately the same height.

8. In combination, a microwave field effect transistor array comprising a plurality of field effect transistors situated on a substrate wherein each transistor has a gate, a source, and a drain and wherein each transistor has a gate pad and a drain pad, and wherein each of the gate pads is situated adjacent a common edge of the substrate and each of the drain pads is situated adjacent another common edge, the array further comprising means for connecting each of the gate pads to a first bus on a substrate carrier and means for connecting each of the drain pads to a second bus on the carrier, wherein the means for connecting each of the gate pads comprises at least one rectangular first conductive member interconnecting a plurality of gate pads to the first bus, each of the gate pads being connected adjacent a common edge of the first member, an opposite edge of the first member being connected to the first bus and wherein the means for connecting each of the drain pads comprises at least one second rectangular conductive member interconnecting a plurality of drain pads to the second bus, each of the drain pads being connected adjacent a common edge of the second member, an opposite edge of the second member being connected to the second bus, the substrate carrier comprising a conductive base, the two conductive busses being located on a major surface of the base at opposite edges thereof, the sources of the array being connected to the major surface such that the substrate is inverted inside the carrier in flip chip fashion.

9. A means for interconnecting a plurality of like pads of an array of radio frequency devices to a bus comprising a rectangular flat conductive member, said member having at least four edges, said member being connected along a first edge of the member to a selected plurality of the pads, an opposite edge of the member being connected to the bus, each said device being comprised of a semiconductor substrate, the substrate comprising a source, a drain, a channel separating the source from the drain, said device further comprising a gate pad connected to the channel and a drain pad connected to the drain, and said member being bilaterally symmetric about a central bisector transverse to the first edge.

10. The means of claim 9, wherein the member has at least two digitated submembers formed at the first edge of the member, each of the submembers having a major surface, each of the submembers being connected at the entire major surface to a different pad of the selected plurality of pads.

* * * * *

UNITED STATES PATENT OFFICE
CERTIFICATE OF CORRECTION

PATENT NO. : 4,034,399

DATED : July 5, 1977

INVENTOR(S) : Ira Drukier and Edward Mykietyn

It is certified that error appears in the above-identified patent and that said Letters Patent are hereby corrected as shown below:

| | | |
|---|---|---|
| Column 2 | line 8 | "to" should be --- into --- |
| | line 19 | delete "such" (second occurrence) |
| | line 49 | "in" should be --- into --- |
| Column 4 | line 9 | "of" (first occurrence) should be --- on --- |
| | line 23 | "end" should be --- ends --- |
| Column 5 | line 3 | after "wire" insert --- will --- |
| | line 42 | after "conductive" insert --- member --- |
| | line 60 | "concuctive" should be --- conductive --- |
| Column 6 | line 48 | after "retain a" insert --- good --- |
| Column 7 | line 18 | "FIG." should be --- FIGS. --- |

Signed and Sealed this

Twenty-fifth Day of October 1977

[SEAL]

Attest:

RUTH C. MASON  
Attesting Officer

LUTRELLE F. PARKER  
Acting Commissioner of Patents and Trademarks